(12) United States Patent
Lambert

(10) Patent No.: US 10,732,349 B2
(45) Date of Patent: Aug. 4, 2020

(54) BROADBAND BACK MIRROR FOR A III-V CHIP IN SILICON PHOTONICS

(71) Applicant: Skorpios Technologies, Inc., Albuquerque, NM (US)

(72) Inventor: Damien Lambert, Los Altos, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 74 days.

(21) Appl. No.: 15/426,375

(22) Filed: Feb. 7, 2017

(65) Prior Publication Data

US 2017/0229840 A1  Aug. 10, 2017

Related U.S. Application Data

(60) Provisional application No. 62/292,633, filed on Feb. 8, 2016, provisional application No. 62/292,675, filed
(Continued)

(51) Int. Cl.
*H01S 5/02* (2006.01)
*G02B 6/12* (2006.01)
(Continued)

(52) U.S. Cl.
CPC ......... *G02B 6/12002* (2013.01); *G02B 6/122* (2013.01); *G02B 6/12004* (2013.01);
(Continued)

(58) Field of Classification Search
CPC ............ G02B 6/12002; G02B 6/12004; G02B 2006/12142; G02B 2006/12147; G02B 2006/12061; G02B 2006/12104; G02B 2006/12121; G02B 6/122; G02B 6/136; G02B 6/12007; H01S 5/02252; H01S 5/4025; H01S 5/021; H01S 5/028;
(Continued)

(56) References Cited

U.S. PATENT DOCUMENTS 3,894,789 A   7/1975  Kobayashi
5,180,685 A   1/1993  Yamamoto et al.
(Continued)

FOREIGN PATENT DOCUMENTS

CN   101276995    10/2008
CN   103858294    6/2014
(Continued)

OTHER PUBLICATIONS

Cherchi, et al.; "Dramatic size reduction of waveguide bends on a micron-scale silicon photonic platform"; *Optics Express*, Jul. 29, 2013; vol. 21, No. 15; DOI:10.1364/OE.21.017814; all pages.
(Continued)

*Primary Examiner* — Xinning(Tom) Niu
(74) *Attorney, Agent, or Firm* — Kilpatrick Townsend & Stockton LLP

(57) ABSTRACT

A semiconductor laser has a mirror formed in a gain chip. The mirror can be placed in the gain chip to provide a broadband reflector to support multiple lasers using the gain chip. The mirror can also be placed in the gain chip to have the semiconductor laser be more efficient or more powerful by changing an optical path length of the gain of the semiconductor laser.

20 Claims, 5 Drawing Sheets

Related U.S. Application Data on Feb. 8, 2016, provisional application No. 62/292,636, filed on Feb. 8, 2016.

(51) Int. Cl.

| | |
|---|---|
| H01S 5/022 | (2006.01) |
| G02B 6/122 | (2006.01) |
| G02B 6/136 | (2006.01) |
| H01S 5/026 | (2006.01) |
| H01S 5/028 | (2006.01) |
| H01S 5/22 | (2006.01) |
| H01S 5/30 | (2006.01) |
| H01S 5/343 | (2006.01) |
| H01S 5/40 | (2006.01) |
| H04B 10/50 | (2013.01) |
| H04J 14/02 | (2006.01) |

(52) U.S. Cl.
CPC ......... *G02B 6/12007* (2013.01); *G02B 6/136* (2013.01); *H01S 5/021* (2013.01); *H01S 5/0202* (2013.01); *H01S 5/026* (2013.01); *H01S 5/028* (2013.01); *H01S 5/02252* (2013.01); *H01S 5/22* (2013.01); *H01S 5/3013* (2013.01); *H01S 5/343* (2013.01); *H01S 5/4025* (2013.01); *H01S 5/4087* (2013.01); *H04B 10/505* (2013.01); *H04J 14/02* (2013.01); *G02B 2006/12061* (2013.01); *G02B 2006/12104* (2013.01); *G02B 2006/12121* (2013.01); *G02B 2006/12142* (2013.01); *G02B 2006/12147* (2013.01)

(58) Field of Classification Search
CPC .... H01S 5/4087; H01S 5/3013; H01S 5/0202; H01S 5/343; H01S 5/22; H01S 5/026; H04J 14/02; H04B 10/505
See application file for complete search history.

(56) References Cited

U.S. PATENT DOCUMENTS

| | | | |
|---|---|---|---|
| 5,780,875 A | | 7/1998 | Tsuji et al. |
| 6,259,841 B1 * | | 7/2001 | Bhagavatula ...... G02B 6/12007 385/129 |
| 6,393,171 B2 | | 5/2002 | Sasaki et al. |
| 6,888,984 B2 | | 5/2005 | Abeles |
| 7,359,593 B2 | | 4/2008 | Little |
| 7,470,069 B1 | | 12/2008 | Offrein et al. |
| 7,805,037 B1 | | 9/2010 | Van Der Vliet et al. |
| 8,064,493 B2 | | 12/2011 | Behfar et al. |
| 8,463,088 B1 | | 6/2013 | Asghari et al. |
| 8,755,650 B2 | | 6/2014 | Peng |
| 9,048,958 B2 | | 6/2015 | Chaahoub et al. |
| 9,097,846 B2 | | 8/2015 | Mizrahi et al. |
| 2003/0034538 A1 | | 2/2003 | Brophy et al. |
| 2003/0044118 A1 | | 3/2003 | Zhou |
| 2003/0165293 A1 | | 9/2003 | Abeles |
| 2005/0117844 A1 | | 6/2005 | Abeles |
| 2005/0123244 A1 | | 6/2005 | Block |
| 2005/0202554 A1 | | 9/2005 | Luo |
| 2006/0104322 A1 | | 5/2006 | Park |
| 2006/0115215 A1 | | 6/2006 | Liu |
| 2006/0210215 A1 | | 9/2006 | Aoki et al. |
| 2006/0285797 A1 | | 12/2006 | Little |
| 2007/0116410 A1 | | 5/2007 | Kwakernaak |
| 2007/0147761 A1 | | 6/2007 | Kwakernaak |
| 2007/0242919 A1 | | 10/2007 | Welch |
| 2008/0180340 A1 | | 7/2008 | Hobbs |
| 2008/0304826 A1 | | 12/2008 | Sochava |
| 2009/0250093 A1 * | | 10/2009 | Chen ................... H01L 31/068 136/246 |
| 2009/0303579 A1 | | 12/2009 | Winterberg |
| 2010/0040327 A1 | | 2/2010 | Deki |
| 2010/0213467 A1 | | 8/2010 | Lee et al. |
| 2010/0284019 A1 | | 11/2010 | Fukuda |
| 2010/0284698 A1 | | 11/2010 | McColloch |
| 2010/0303469 A1 | | 12/2010 | Barton et al. |
| 2010/0316076 A1 | | 12/2010 | Behfar et al. |
| 2011/0085572 A1 * | | 4/2011 | Dallesasse ............ H01S 5/021 372/20 |
| 2011/0205660 A1 | | 8/2011 | Komura |
| 2011/0280579 A1 | | 11/2011 | McClaren et al. |
| 2013/0039664 A1 | | 2/2013 | Clifton et al. |
| 2013/0051727 A1 | | 2/2013 | Mizrahi et al. |
| 2013/0064514 A1 | | 3/2013 | Peng |
| 2013/0230272 A1 | | 9/2013 | Raj et al. |
| 2014/0029951 A1 | | 1/2014 | Handelman |
| 2014/0177222 A1 | | 6/2014 | Barwicz et al. |
| 2014/0185980 A1 | | 7/2014 | Lei et al. |
| 2014/0219305 A1 | | 8/2014 | Fang et al. |
| 2014/0342479 A1 | | 11/2014 | Marchena |
| 2014/0352759 A1 * | | 12/2014 | Barnes ................ H01L 31/0525 136/246 |
| 2015/0097210 A1 | | 4/2015 | Krasulick et al. |
| 2015/0098676 A1 | | 4/2015 | Krasulick et al. |
| 2015/0099318 A1 * | | 4/2015 | Krasulick ......... H01L 31/02327 438/27 |
| 2015/0123157 A1 | | 5/2015 | Dallesasse et al. |
| 2015/0177458 A1 | | 6/2015 | Bowers et al. |
| 2015/0249501 A1 | | 9/2015 | Nagarajan |
| 2015/0255952 A1 | | 9/2015 | Chaouch et al. |
| 2015/0260913 A1 | | 9/2015 | Li et al. |
| 2015/0341123 A1 | | 12/2015 | Nagarajan |
| 2016/0301191 A1 | | 10/2016 | Orcutt |

FOREIGN PATENT DOCUMENTS

| | | |
|---|---|---|
| WO | 2002065600 A2 | 8/2002 |
| WO | 2003044571 A2 | 5/2003 |
| WO | 2014-083507 A2 | 6/2014 |
| WO | 2015-054491 A1 | 4/2015 |

OTHER PUBLICATIONS

Li, et al.; "High-Speed Optical Transmitter with a Silicon Substrate"; U.S. Appl. No. 15/426,823, filed Feb. 7, 2017.
Lambert; "Stepped Optical Bridge for Connecting Semiconductor Waveguides"; U.S. Appl. No. 15/426,366, filed Feb. 7, 2017.
PCT/US2017/016994 received and International Report on Patentability dated Aug. 23, 2018, 8 pages.
PCT/US2017/016994 filed Feb. 8, 2017 received an ISR/WO dated Apr. 20, 2017, 10 pages.
PCT/US2017/016958 filed Feb. 8, 2017 received an ISR/WO dated Apr. 25, 2017, 12 pages.
PCT/US2017/016968 filed Feb. 8, 2017 received an ISR/WO mailed Apr. 25, 2017, 11 pages.
EP17750687.0 received an Extended European Search Report dated Feb. 5, 2020, 12 pages.
EP17750687.0 received a Partial Supplemental European Search Report dated Oct. 31, 2019, 14 pages.
EP17750673.0 received a Partial Supplementary European Search Report dated Oct. 7, 2019, 13 pages.
CN Application No., CN201780018613.X received an Office Action dated Mar. 27, 2020, 16 pages.

* cited by examiner

BROADBAND BACK MIRROR FOR A III-V CHIP IN SILICON PHOTONICS

CROSS-REFERENCES TO RELATED APPLICATIONS

This application claims priority to U.S. Provisional Application No. 62/292,633, filed on Feb. 8, 2016, entitled "High-Speed Optical Transmitter with a Silicon Substrate," U.S. Provisional Application No. 62/292,675, filed on Feb. 8, 2016, entitled "Stepped Optical Bridge for Connecting Semiconductor Waveguides," and U.S. Provisional Application No. 62/292,636, filed on Feb. 8, 2016, entitled "Broadband Back Mirror for a III-V Chip in Silicon Photonics," the disclosures of which are incorporated by reference for all purposes.

The following three U.S. patent applications (including this one) are being filed concurrently, and the entire disclosure of the other applications are incorporated by reference into this application for all purposes:

application Ser. No. 15/426,823, filed Feb. 7, 2017, entitled "High-Speed Optical Transmitter with a Silicon Substrate";

application Ser. No. 15/426,366, filed Feb. 7, 2017, entitled "Stepped Optical Bridge for Connecting Semiconductor Waveguides"; and application Ser. No. 15/426,375, filed Feb. 7, 2017, entitled "Broadband Back Mirror for a III-V Chip in Silicon Photonics."

BACKGROUND OF THE INVENTION

Silicon integrated circuits ("ICs") have dominated the development of electronics and many technologies based upon silicon processing have been developed over the years. Their continued refinement led to nano-scale feature sizes that can be important for making metal oxide semiconductor CMOS circuits. On the other hand, silicon is not a direct-bandgap material. Although direct-bandgap materials, including III-V semiconductor materials, have been developed, there is a need in the art for improved methods and systems related to photonic ICs utilizing silicon substrates. This application relates to optical transmitters and optical waveguides. More specifically, and without limitation, to optical lasers and/or optical waveguides in silicon.

BRIEF SUMMARY OF THE INVENTION

A semiconductor chip (referred to as a "chip" or a "chiplet") having a direct bandgap (e.g., made of III-V material, such as GaAs or InP) is bonded in a recess of a silicon wafer (e.g., an SOI wafer). A resonator cavity is made by a first reflector in silicon (e.g., a Bragg grating) and a second reflector in or on the chip, with at least a portion of the chip between the first reflector and the second reflector, the portion of the chip is used as a gain for a semiconductor laser.

In some embodiments, a semiconductor laser comprises a platform, gain medium, a wall in the gain medium, a coating on the wall forming a mirror, and a ridge formed in the gain medium, wherein: the platform is made of a first semiconductor material; the platform comprises a waveguide; the gain medium is made of a second semiconductor material; the second semiconductor material has a direct bandgap; the gain medium comprises a first edge; the gain medium comprises a second edge; the first edge is opposite the second edge; the wall is between the first edge and the second edge; the ridge is configured to guide light in the gain medium; the ridge comprises a first end and a second end; the first end is opposite the second end; the first end terminates at the mirror; and/or the second end is optically coupled with the waveguide. In some embodiments, the first semiconductor material is silicon and the second semiconductor material comprises a III-V material; the coating comprises a dielectric layer and a metal and the dielectric layer is between the wall and the metal; the dielectric layer is transparent to light corresponding to an energy of a bandgap of the second semiconductor material; the dielectric layer has a thickness between 25 nm and 100 nm; the wall is a first wall, the gain medium comprises a second wall, the second wall is opposite the first wall, the second wall and the first wall define a recessed region in the gain medium, and the recessed region is between the first edge and the second edge; the coating is disposed on the second wall, and the coating disposed on the second wall is part of the mirror such that the mirror comprises two reflective surfaces; the first edge and the second edge of the gain medium are formed by cleaving a semiconductor wafer; the wall is skew in relation to the first edge; and/or the gain medium is the gain for two, six, or more lasers. In some embodiments, the semiconductor laser further comprises a reflector in the platform, wherein the mirror and the reflector form a resonator cavity for the semiconductor laser.

In some embodiments, a method for fabricating a semiconductor laser with a mirror in a gain medium comprises: bonding a chip to a platform, defining a ridge on the chip, etching the chip to form a wall in the chip, and applying a coating to the wall to form the mirror, wherein: the chip comprises a first semiconductor material; the chip has a first edge; the chip has a second edge; the platform comprises a second semiconductor material; the ridge is configured to guide light in the chip; the ridge comprises a first end and a second end; the first end is opposite the second end; the platform comprises a waveguide; the second end is optically coupled with the waveguide; etching the chip forms the wall in the chip between the first edge of the chip and the second edge of the chip; and etching the chip to form the wall defines the second end of the ridge. In some embodiments, etching the chip to form the wall occurs after bonding the chip to the platform; the mirror is a first mirror, and the method further comprises forming a second mirror between the first edge and the second edge of the chip; applying the coating comprises: applying a dielectric layer to the wall, and applying a metal to the dielectric layer, after applying the dielectric layer to the wall; and/or the wall is a first wall, etching the chip to form the first wall forms a second wall, the first wall and the second wall define a recessed region in the chip, and applying the coating to the first wall also applies the coating to the second wall, such that the mirror comprises two reflective surfaces.

In some embodiments, a semiconductor laser comprises a chip, a first wall and a second wall in the chip, a coating disposed on the first wall and on the second wall, wherein: the chip is made of a semiconductor material; the semiconductor material has a direct bandgap; the chip comprises a first edge; the chip comprises a second edge; the first edge is opposite the second edge; the first wall and the second wall are between the first edge and the second edge; the first wall and the second wall define a recessed portion in the chip; and/or the coating forms a mirror in the chip. In some embodiments the semiconductor laser comprises a platform and/or a ridge formed in the chip, wherein: the platform is made of a first semiconductor material; the platform comprises a waveguide; the chip is bonded to the platform; the ridge is configured to guide light in the chip; the ridge comprises a first end and a second end; the first end is opposite the second end; the first end terminates at the mirror; and/or the second end is optically coupled with the waveguide. In some embodiments, the semiconductor laser comprises three or more ridges formed in the chip, wherein each ridge of the three or more ridges terminates at the mirror; and/or three or more waveguides, wherein the three or more waveguides are each optically coupled with one ridge of the three or more ridges.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments relate to forming a mirror in a III-V chip to create a broadband mirror for one or more resonator cavities of one or more lasers. A chip is bonded to a platform. In some embodiments, the chip is made of III-V material and the platform is a silicon-on-insulator (SOI) wafer. In some embodiments, bonding is used as described in U.S. application Ser. No. 14/509,914, filed on Oct. 8, 2014, which is incorporated by reference. In some embodiments, chips are formed from epitaxial layers of compound semiconductor material (e.g., III-V materials). In some embodiments, chips are used to perform functions that are difficult for silicon to perform (e.g., a chip with a direct bandgap is used as a gain medium or a modulator for a laser; silicon has an indirect bandgap making silicon a poor optical emitter). An example of a tunable laser using a chip for a gain medium, and reflectors in silicon, is given in U.S. application Ser. No. 14/642,443, filed on Mar. 9, 2015, which is incorporated by reference. In some embodiments, chips are formed by dicing a semiconductor wafer and/or bonding the chips to the substrate using template assisted bonding, such as described in U.S. application Ser. No. 14/261,276, filed on Apr. 24, 2014, and U.S. application Ser. No. 14/482,650, filed on Sep. 10, 2014, which are incorporated by reference. In some embodiments, thick silicon is used to more efficiently couple (e.g., butt couple) waveguides in silicon with ridges (for optical mode confinement) in chips. In some embodiments, thick silicon is between 0.7 µm and 5 µm, or from 1 µm to 2.5 µm.

Figure 1:
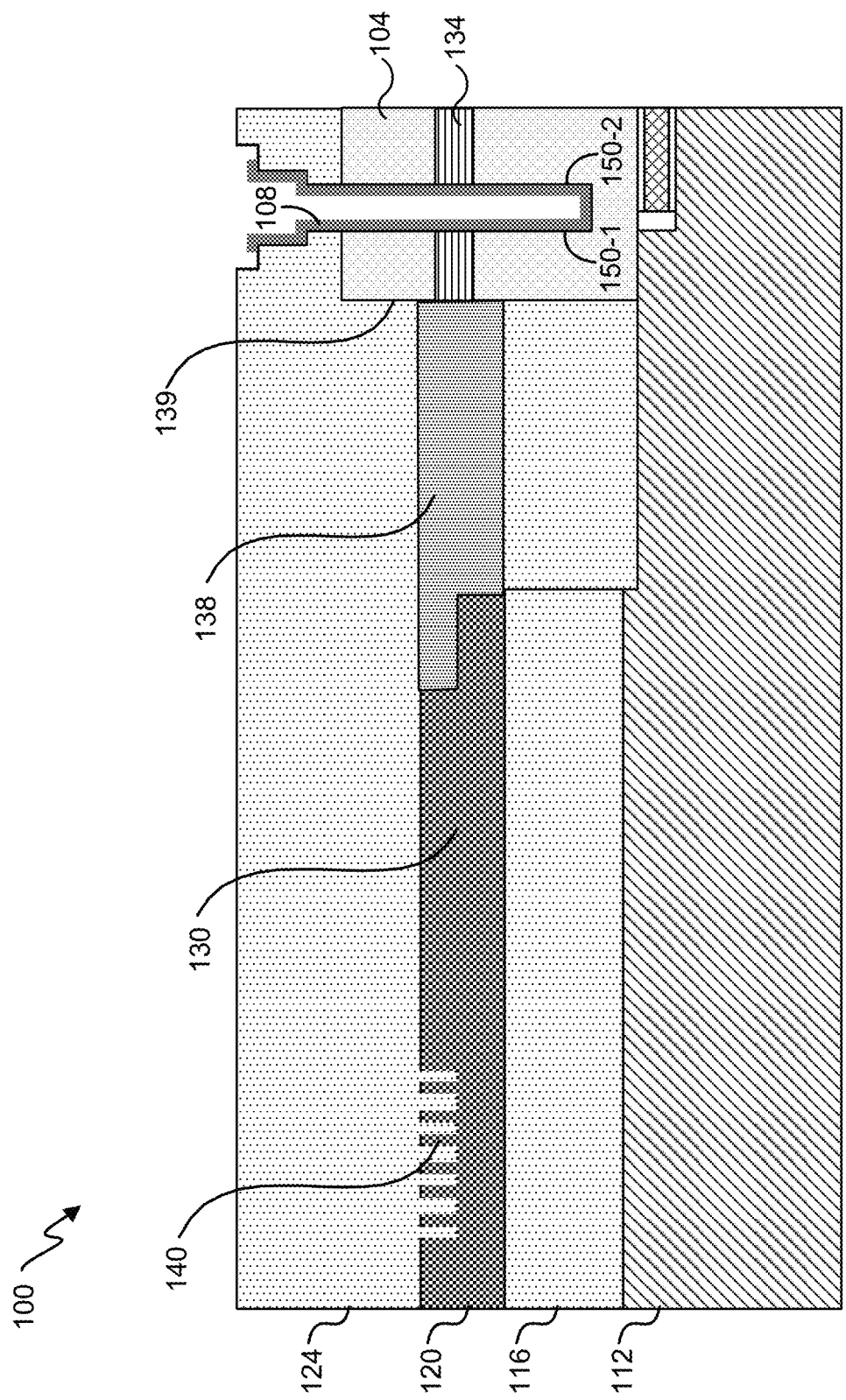
FIG. 1 depicts a simplified cross-sectional side view of an embodiment of a mirror formed in a gain medium.

Referring first to FIG. 1, a simplified partial view of a cross-sectional side view of an embodiment of an optical device 100 comprising a chip 104 with a mirror 108 in the chip 104. The chip 104 is used as a gain medium for a laser. The chip 104 is mounted to a platform. The platform is made from an SOI wafer and comprises a substrate 112, and insulating layer 116, and a device layer 120. The substrate 112 is made of crystalline silicon (c-Si). The insulating layer 116 is made of silicon dioxide (SiO2). The device layer 120 is made of c-Si. A covering 124 (e.g., of SiO2) is a top layer of the optical device 100. The covering 124 hermetically seals the chip 104 in a recess of the platform and/or provides an upper cladding for a silicon waveguide 130 formed in the device layer 120. The device layer 120 is between the insulating layer 116 and the covering 124. The insulating layer 116 is between the device layer 120 and the substrate 112. The substrate 112 is a handle portion of the SOI wafer, the insulating layer 116 is a buried oxide (BOX) of the SOI wafer, and the device layer 120 is a device layer of the SOI wafer.

The chip 104 comprises an active region 134. The active region 134 of the chip 104 shown is a multiple quantum well (MQW) region. The active region 134 of the chip 104 is aligned with the device layer 120, and hence aligned with the silicon waveguide 130 of the platform. An optical bridge 138 optically couples the active region 134 of the chip 104 with the silicon waveguide 130. An example of forming an optical bridge is given in U.S. Pat. No. 9,097,846, issued Aug. 4, 2015, which is incorporated by reference. Another example of an optical bridge is given in the '366 application entitled "Stepped Optical Bridge for Connecting Semiconductor Waveguides," filed concurrently with this disclosure. The chip comprises an edge 139 (e.g., formed from dicing the chip). The edge 139 defines an outer portion of a side of the chip 104.

A grating 140 is formed in the device layer 120 of the platform. The grating 140 is optically coupled with the silicon waveguide 130. A mirror 108 is formed in and/or on the chip 104. The grating 140 is a first reflector. The mirror 108 is a second reflector. The grating 140 and the mirror 108 form an optical resonator cavity for a laser. In some embodiments, the grating 140 is a Bragg reflector. In some embodiments, the grating 140 is a distributed Bragg reflector (DBR). In some embodiments, the grating 140 is a binary superimposed grating (BSG). In some embodiments, the grating 140 is tunable. In some embodiments, the mirror 108 is broadband (e.g., having higher than 60% reflectivity for a wavelength range greater than 200, 500, 1000, 2000, or 5000 nm). In some embodiments, the grating 140 has a narrower reflectivity bandwidth than the mirror 108 (e.g., the reflectivity bandwidth of the grating 140 is equal to or less than a half, a quarter, or an eighth, of the reflectivity bandwidth of the mirror 108).

In some embodiments, the mirror 108 is formed by etching a trench in the chip 104. In some embodiments, two trenches, three trenches, or more trenches are etched to form the mirror 108. In some embodiments, successive trenches are more narrow and deeper than earlier trenches. In some embodiments, multiple trenches are etched to facilitate application of reflective material. The trench is defined by a first wall 150-1 and a second wall 150-2 in the chip 104. The trench is etched deeper than the active region 134 of the chip 104. The trench can be formed in many different places in the chip 104 depending on intent. For example, a mirror 108 formed closer to the optical bridge 138 will provide less lasing power (e.g., because of less gain) than a mirror 108 formed further away from the optical bridge 138 (e.g., because of more gain). For some applications, less lasing power is more beneficial because less electrical power is consumed and less heat is produced. Some applications require higher laser power (e.g., to get better signal-to-noise ratio). Variable placement of the mirror 108 in the chip 104 allows a manufacturer to produce lasers with different lasing power for different applications without many manufacturing changes.

In some embodiments, the mirror 108 comprises a spacer and a metal. After the trench is formed in the chip 104, a dielectric layer (a dielectric insulator) is deposited in the trench (e.g., to walls 150). After the dielectric layer is applied, a reflective layer (e.g., a metal) is applied (e.g., Al, Ag, Au, Cu and/or W). The dielectric layer electrically isolates the chip 104 from the metal used for the mirror 108.

Figure 2:
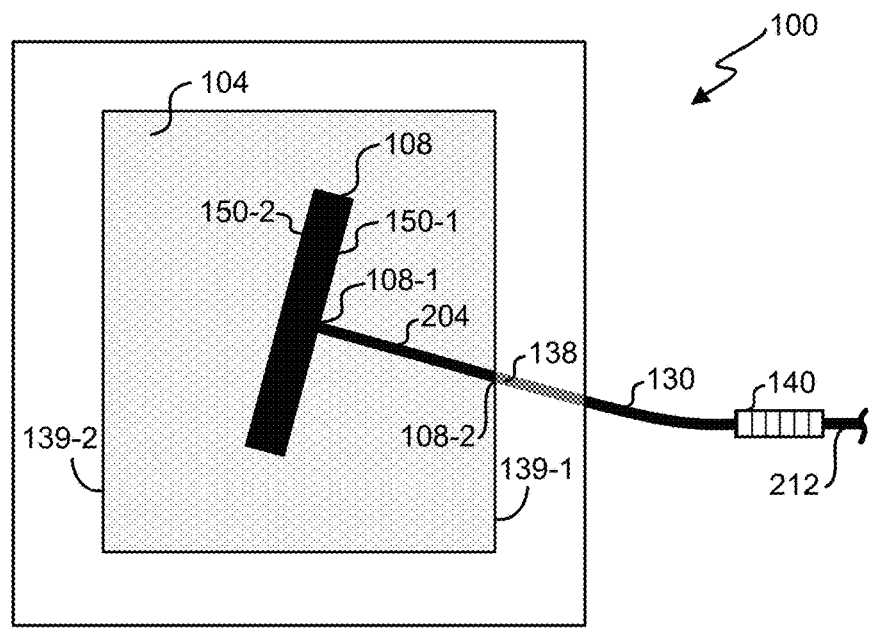
FIG. 2 depicts a simplified top view of an embodiment of the mirror in the gain medium.

In FIG. 2, a simplified top view of an embodiment of the optical device 100 comprising a mirror 108 in the chip 104 is shown. The covering 124 is not shown. The optical device 100 is a laser. The laser comprises the mirror 108 and the grating 140, which forms an optical resonator. The chip 104 is used as the gain medium of the laser. The chip 104 comprises a first edge 139-1 and a second edge 139-2. The first edge 139-1 and the second edge 139-2 are cleaved facets formed from dicing a semiconductor wafer to form multiple chips 104. The chip 104 comprises the first wall 150-1 and the second wall 150-2 defining a trench in the chip 104. Metal is deposited on the first wall 150-1 to form the mirror 108. In some embodiments, a dielectric layer and a metal layer are deposited on the first wall 150-1 to form the mirror 108. In some embodiments, the dielectric layer is transparent to a predetermined wavelength(s). For example, the dielectric layer is transparent (e.g., greater than 50%, 70%, or 90% transmission) for wavelengths corresponding to an energy of the active region 134 of the chip 104 (e.g., transparent to wavelengths between 1200 nm and 1700 nm, such as between 1260 nm to 1360 nm and/or 1565 nm to 1625 nm). In some embodiments, one or more of the following materials are used for the dielectric layer: SiO2, SiNx, HFO2, Al2O3, TiO2. In some embodiments, the higher the refractive index of the dielectric layer the better. The dielectric layer has a thickness. In some embodiments, the thinner the dielectric layer the better, to the limit of electrical breakdown. In some embodiments, the thickness of the dielectric layer is equal to or between a couple monolayers and 100 nm. In some embodiments, the dielectric layer has a minimum thickness between a couple monolayers and 0.2 µm. In some embodiments, the dielectric layer has a maximum thickness between 30 nm and 100 nm (e.g., 40, 50, 60, 70, or 80 nm).

A ridge 204 is formed on the chip 104. In some embodiments, the ridge 204 is formed by etching. The ridge 204 guides an optical mode in the chip 104. In some embodiments, the ridge 204 is formed orthogonal to the mirror 108 (and thus orthogonal to the first wall 150-1). In some embodiments, the first edge 139-1 is parallel to the second edge 139-2; and the first wall 150-1 is skew (not parallel) to the first edge 139-1 and/or to the second edge 139-2. The first wall 150-1 is skew to the first edge 139-1 to reduce reflections from light propagating from the chip 104 to the optical bridge 138. The ridge 204 comprises a first end 208-1 and a second end 208-2. The first end 208-1 is opposite the second end 208-2 in a direction of beam propagation. The first end 208-1 terminates the ridge 204 at the mirror 108. The second end 208-2 is optically coupled with the silicon waveguide 130 (e.g., through the optical bridge 138). In some embodiments, the optical bridge is formed by amorphous silicon on top of an insulator (e.g., SiO2 and/or SiNx). An optical waveguides 212 is used to route light from the laser to another location on the platform. In some embodiments, the optical waveguide 212 has a core made of crystalline silicon.

In some embodiments, the grating 140 is tunable (e.g., by applying heat to the grating 140). In some embodiments, the grating 140 enables precise wavelength control of the laser. In some embodiments, the grating 140 is tuned to a longitudinal mode of the resonator cavity.

Figure 3:
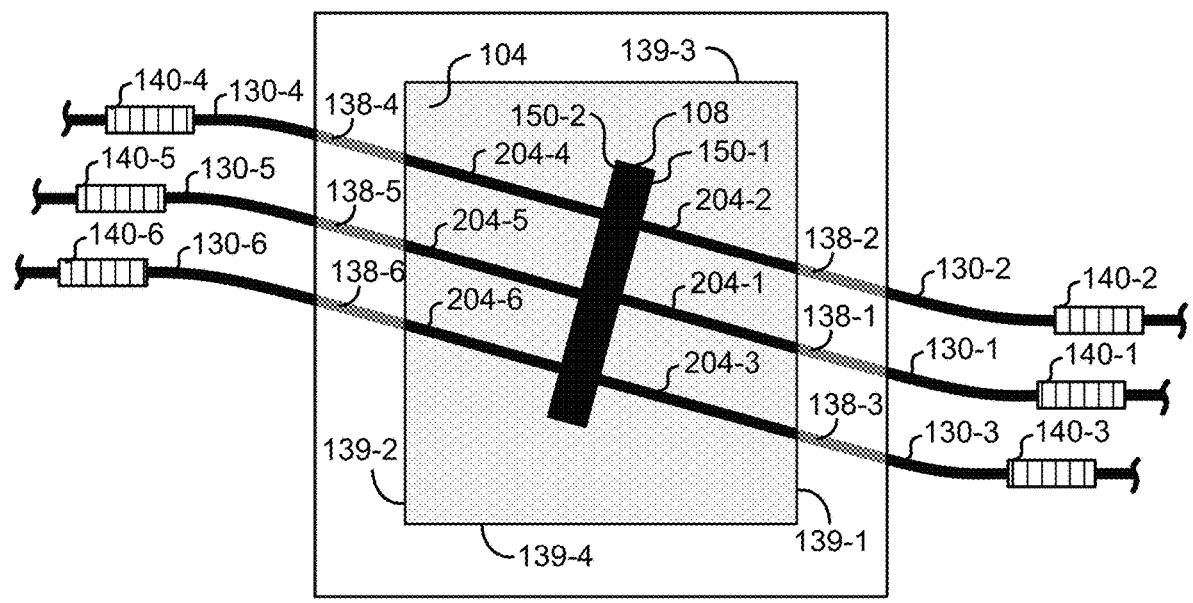
FIG. 3 depicts a simplified top view of an embodiment of a mirror in the gain medium, wherein the gain medium has multiple waveguides for multiple lasers.

In FIG. 3, a simplified top view of an embodiment of one mirror 108, in one chip 104, being part of multiple lasers is shown. More than one laser can be integrated into a silicon wafer from one chip. A first wall 150-1 and a second wall 150-2 are formed in chip 104 (e.g., by etching a trench in the chip 104). A coating is placed on the walls 150 to form the mirror 108 (e.g., a two-layer coating comprising the dielectric layer and a metal). A first ridge 204-1, a second ridge 204-2, and a third ridge 204-3, extend from the first wall 150-1 of the trench to the first edge 139-1 of the chip 104. A fourth ridge 204-4, a fifth ridge 204-5, and a sixth ridge 204-6, extend from the second wall 150-2 of the trench to the second edge 139-2 of the chip 104.

There are six gratings 140 in the platform (e.g., in the device layer 120) that act as first reflectors, one for each laser. The mirror 108 acts as the second reflector for each laser. In some embodiments, some and/or all of the six gratings 140 are made to the same specification (e.g., same pitch). In some embodiments, some and/or all gratings 140 are made differently (for different wavelengths) than others. In some embodiments, the ridges 204 are spaced between 20 µm and 100 µm a part; or from 30 µm to 60 µm apart. In some embodiments, the lasers share electrical contacts so the lasers are driven together. In some embodiments, each laser, of the six lasers, has individual electrical contacts for injecting current into the chip 104 so current for each laser can be applied separately. Having two or more lasers share the chip 104 reduces a footprint size on a board.

The chip 104 shown in FIG. 3 is a bidirectional chip because ridges 204 on the chip 104 extend to two edges 139 of the chip 104, the first edge 139-1 and the second edge 139-2. In some embodiments, the mirror 108 has more than two edges 139. For example, instead of a trench forming two walls 150, a square mirror is formed having four walls and ridges extend to a third edge 139-3 and/or a fourth edge 139-4 of the chip (a quad-directional chip). Off-center placement of the mirror 108, or forming a rectangular mirror, in the chip 104 would make some lasers have higher optical power than other lasers.

Figure 4:
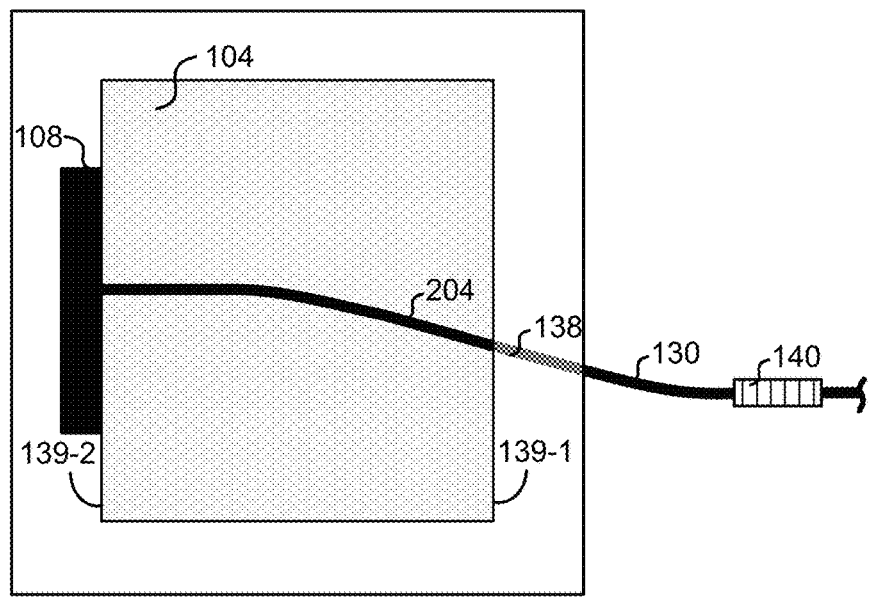
FIG. 4 depicts a simplified top view of an embodiment of a gain medium with a curved waveguide in the gain medium.

In FIG. 4, a simplified top view of an embodiment of a gain medium with a curved ridge 204 in the gain medium is shown. The chip 104 is used as the gain medium. In FIG. 4, the mirror 108 is formed on the second edge 139-2 of the chip 104 (instead of between the first edge 139-1 and the second edge 139-2). The second edge 139-2 is a cleaved facet of the chip 104, and the mirror 108 is applied as one or more coatings on the cleaved facet. The first edge 139-1 is parallel with the second edge 139-2. The ridge 204 is orthogonal to the second facet 139-2 and extends in a direction toward the first edge 139-1. The ridge 204 curves before reaching the first edge 139-1 so that the ridge 204 is not orthogonal to the first edge 139-1. The ridge 204 is curved to reduce reflections at the first edge 139-1.

In some embodiments, the mirror 108 is applied to the second edge 139-2 of the chip 104 so that the chip 104 does not need to be etched to make the mirror 108. In some embodiments, the ridge 204 makes an angle with the first edge 139-1. In some embodiments, the angle is one degree, two degrees, 10 degrees, 15 degrees, or values between one degree, two degrees, 10 degrees, and/or 15 degrees.

Embodiments can be combined and rearranged. For example, in FIG. 5, an embodiment of several mirrors 108 formed in the chip 104 are shown. A first mirror 108-1, a second mirror 108-2, a third mirror 108-3, a fourth mirror 108-4, and a fifth mirror 108-5 are formed in the chip 104. The first mirror 108-1 and the first grating 140-1 form an optical resonator for a first laser. The second mirror 108-2 and the second grating 140-2 form an optical resonator for a second laser. The third mirror 108-3 and the third grating 140-3 form an optical resonator for a third laser. The second mirror 108-2 and the fourth grating 140-4 form an optical resonator for a fourth laser. The fourth mirror 108-4 and the fifth grating 140-5 form an optical resonator for a fifth laser. The fifth mirror 108-5 and the sixth grating 140-6 form an optical resonator for a sixth laser. In some embodiments, multiple mirrors are used to reduce or increase how much power is used in each laser.

Figure 6:
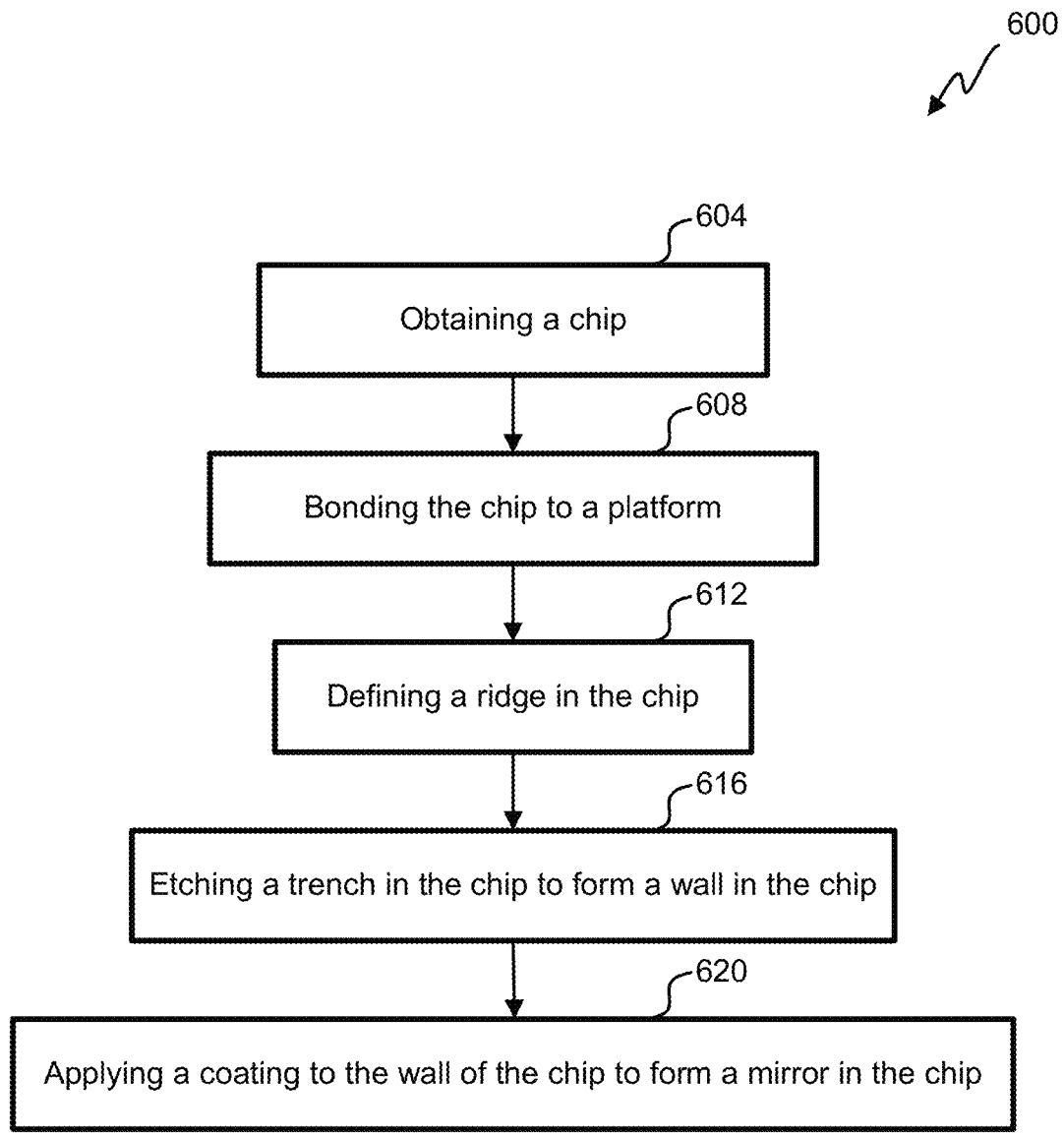
FIG. 6 illustrates a flowchart of an embodiment of a process for fabricating a mirror in a gain medium.

FIG. 6 illustrates a flowchart of an embodiment of a process 600 for fabricating a laser system with a mirror in the gain medium. Process 600 begins in step 604 with obtaining a chip 104. In some embodiments, the chip 104 is obtained by dicing a semiconductor wafer (e.g., a III-V wafer with quantum well epitaxial grown on a substrate; a substrate of GaAs or InP). Vertical is defined as a direction parallel with a vector normal to a surface of the substrate of the semiconductor wafer. The chip comprises III-V material. The chip 104 comprises a first edge 139-1 and a second edge 139-2. The edges 139 are orthogonal to a top surface and a bottom surface of the chip 104. The first edge 139-1 is opposite the second edge 139-2.

In step 608, the chip 104 is bonded to a platform. In some embodiments, the platform is an SOI wafer with a substrate 112, an insulating layer 116, and a device layer 120. The device layer comprises a silicon waveguide 130. The chip 104 is bonded in a recess of the platform. The active region 134 of the chip 104 is aligned with the device layer 120 of the SOI wafer. The chip 104 is optically coupled with the silicon waveguide 130 using an optical bridge 138 (e.g., edge coupled; light is transmitted, in a horizontal direction, through an edge 139 of the chip to the platform). In some embodiments, step 620 is omitted.

In step 612, a ridge 204 is defined on the chip 104. In some embodiments, the ridge 204 is defined by applying a photoresist defining a path of the ridge 204 and etching the chip 104 on sides of the path. In step 616, a trench is etched in the chip 104, forming a wall 150. The wall is between the first edge 139-1 and the second edge 139-2. The wall 150 defines a first end 108-1 of the ridge 204 (e.g., the first end 108-1 of the ridge 204 terminates at the mirror 108). The ridge 204 comprises a second end 108-2, which terminates at an edge 139 of the chip 104.

In step 620, a coating is applied to the wall 150 to form the mirror 108. In some embodiments, the wall 150 is not parallel with the first edge 139-1 and/or the second edge 139-2. In some embodiments, the mirror 108 comprises two walls (e.g., the first wall 150-1 and the second wall 150-2). In some embodiments, coating comprises two layers, a dielectric layer and a reflective layer. The ridge 204 guides light from the mirror 108 to an edge 139 of the chip 104.

In some embodiments, two or more ridges 204 are formed on the chip 104. In some embodiments, two or more mirrors 108 are formed in the chip 104. In some embodiments, the ridge 204 is formed on the chip 104 after the chip 104 is bonded to the substrate (e.g., the ridge 204 is formed concurrently with forming the silicon waveguides 130, so that the ridge is aligned with the silicon waveguides 130 by photolithography). In some embodiments, the ridge 204 is formed concurrently with forming the silicon waveguides 130 and/or the gratings 140. In some embodiments, the ridge 204 is formed concurrently with the optical bridge 138.

Figure 7:
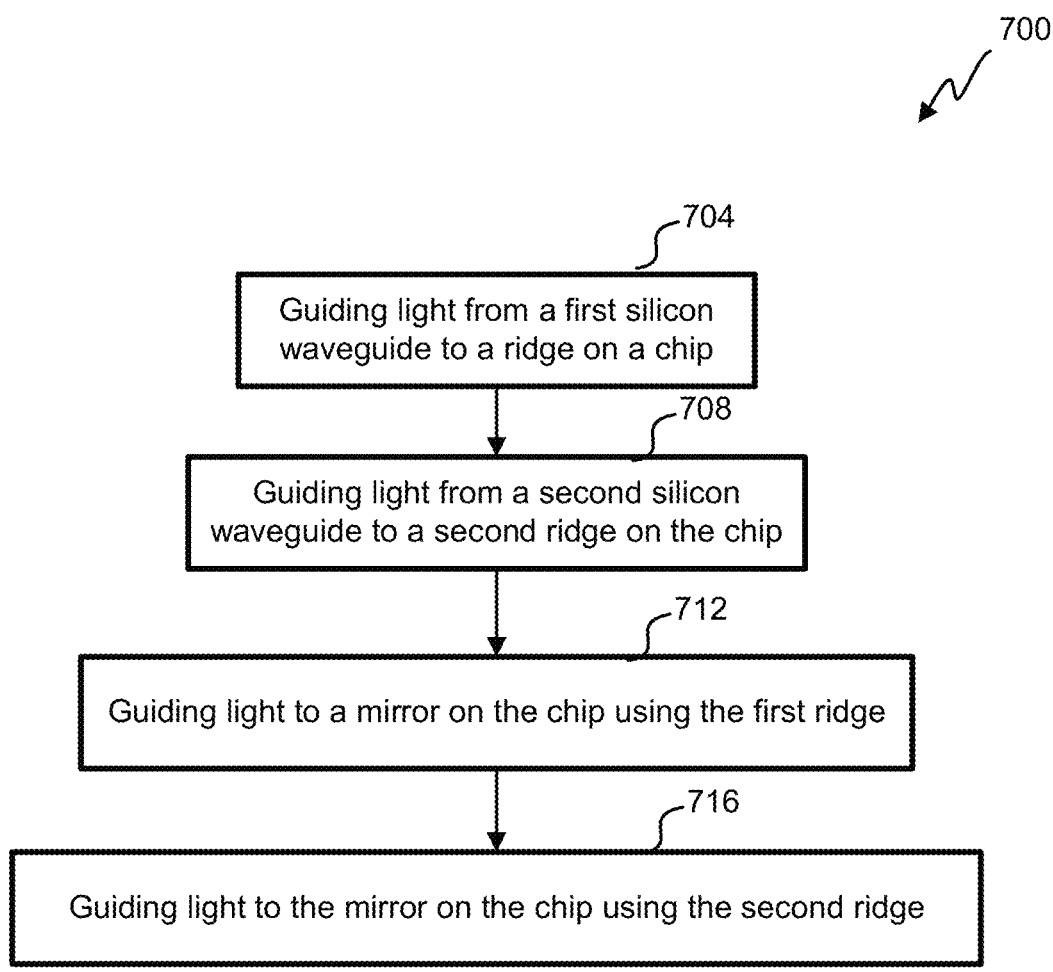
FIG. 7 illustrates a flowchart of an embodiment of a process for operating multiple lasers with a mirror in the gain medium.

FIG. 7 illustrates a flowchart of an embodiment of a process 700 for operating a laser system with a mirror 108 in the gain medium of the laser system. Process 700 begins in step 704 with guiding light from a first silicon waveguide 130-1 to a first ridge 204-1 on a chip 104. The chip 104 comprises III-V material and is used as the gain medium of the laser system. Light is guided from a second silicon waveguide 130-2 to a second ridge 204-2 on the chip 104, step 708. Light is guided to a mirror 108 in the chip using the first ridge 204-1, step 712. The mirror 108 is formed between cleaved facets of the chip 104. Light is guided to the mirror 108 in the chip using the second ridge 204-2, step 716. In some embodiments, the mirror 108 is between the first ridge 204-1 and the second ridge 204-2 (e.g., the second ridge 204-2 being where the fourth ridge 204-4 or the fifth ridge 204-5 in FIG. 3). In some embodiments, the first ridge 204-1 is parallel with the second ridge 204-2 (e.g., at all points of the first ridge 204-1 and the second ridge 204-1 in the chip 104).

The above description of exemplary embodiments of the invention has been presented for the purposes of illustration and description. It is not intended to be exhaustive or to limit the invention to the precise form described, and many modifications and variations are possible in light of the teaching above. The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Figure 5:
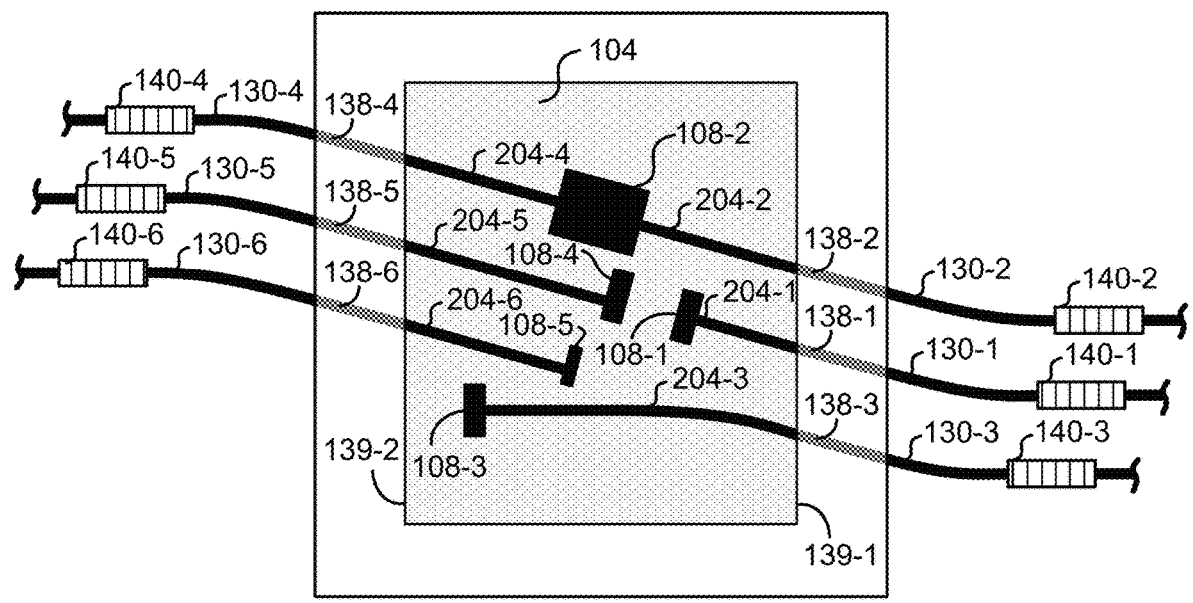
FIG. 5 depicts a simplified top view of an embodiment of a gain medium with several mirrors formed in the gain medium.

For example, the third mirror 108-3 in FIG. 5 could be applied to the second edge 139-2 of the chip 104 such that the chip 104 comprises a mirror on an edge 139 and a mirror between edges 139 (e.g., the first mirror 108-1) of the chip 104. The embodiments were chosen and described in order to explain the principles of the invention and its practical applications to thereby enable others skilled in the art to utilize the invention in various embodiments and with various modifications as are suited to the particular use contemplated. In some embodiments, instead of using the grating 140, a different type of reflector, other than a grating, is used (e.g., a cleaved or etched facet, or a partial mirror etched into the platform similarly as the mirror 108 is formed in the chip by etching and coating).

In some embodiments, a semiconductor laser comprises an optical bridge, wherein the optical bridge is configured to couple light from the ridge of the chip to the waveguide; and the optical bridge comprises an amorphous-silicon core; and/or the ridge is perpendicular with the mirror at the wall, the ridge extends from the wall to the first edge, and the ridge is curved to make a non-perpendicular angle with the first edge at the first edge. In some embodiments, a method for forming the semiconductor comprises a ridge on the chip wherein defining the ridge on the chip occurs after bonding the chip to the platform and before etching the chip to form the wall; the first facet and the second facet are formed by dicing the semiconductor wafer; dicing the semiconductor wafer comprises cleaving; and/or bonding the chip to the platform is performed before applying the coating to form the mirror.

Further, other devices could be made where functionality is split across two or more materials. In some embodiments, the silicon platform comprises a CMOS device, a BiCMOS device, an NMOS device, a PMOS device, a detector, a CCD, diode, heating element, and/or a passive optical device (e.g., a waveguide, an optical grating, an optical splitter, an optical combiner, a wavelength multiplexer, a wavelength demultiplexer, an optical polarization rotator, an optical tap, a coupler for coupling a smaller waveguide to a larger waveguide, a coupler for coupling a rectangular silicon waveguide to an optical fiber waveguide, and a multimode interferometer).

The embodiments were chosen and described in order to explain the principles of the invention and practical applications to thereby enable others skilled in the art to best utilize the invention in various embodiments and with various modifications as are suited to the particular use contemplated.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A semiconductor laser comprising:
a platform, wherein:
the platform is made of a first semiconductor material; and
the platform comprises a waveguide;
a gain medium, wherein:
the gain medium is made of a second semiconductor material;
the second semiconductor material has a direct bandgap;
the gain medium comprises a first edge;
the gain medium comprises a second edge; and
the first edge is opposite the second edge;
a first wall and a second wall forming a trench in the gain medium, wherein the first wall and the second wall are between the first edge and the second edge;
a coating disposed on the first wall, wherein:
the coating comprises a dielectric layer and a metal;
the dielectric layer is between the first wall and the metal; and
the coating forms a mirror in the gain medium; and
a ridge formed in the gain medium, wherein:
the ridge is configured to guide light in the gain medium;
the ridge comprises a first end and a second end;
the first end is opposite the second end;
the first end terminates at the mirror; and
the second end is optically coupled with the waveguide.

2. The semiconductor laser as recited in claim 1, wherein:
the first semiconductor material is silicon; and
the second semiconductor material comprises a III-V material.

3. The semiconductor laser as recited in claim 1, further comprising a reflector in the platform, wherein the mirror and the reflector form a resonator cavity.

4. The semiconductor laser as recited in claim 3, wherein the reflector in the platform is configured to be an output coupler for the semiconductor laser.

5. The semiconductor laser as recited in claim 4, wherein the dielectric layer is transparent to light corresponding to an energy of a bandgap of the second semiconductor material.

6. The semiconductor laser as recited in claim 4, wherein the dielectric layer has a thickness between 25 nm and 100 nm.

7. The semiconductor laser as recited in claim 1, wherein:
a metal coating is disposed on the second wall; and
the metal coating disposed on the second wall forms a mirror on the second wall.

8. The semiconductor laser as recited in claim 7, wherein:
the semiconductor laser is a first laser; and
the mirror on the second wall is configured to reflect light from a second laser.

9. The semiconductor laser as recited in claim 1, wherein the first edge and the second edge of the gain medium are formed by cleaving a semiconductor wafer.

10. The semiconductor laser as recited in claim 1, wherein the first wall is skew in relation to the first edge.

11. The semiconductor laser as recited in claim 1, wherein the gain medium is the gain for two or more lasers.

12. The semiconductor laser as recited in claim 11, wherein the gain medium is the gain for six or more lasers.

13. A method for fabricating a semiconductor laser with a mirror in a gain medium, the method comprising:
bonding a chip to a platform, wherein:
the chip comprises a first semiconductor material;
the chip has a first edge;
the chip has a second edge; and
the platform comprises a second semiconductor material;
defining a ridge on the chip, wherein:
the ridge is configured to guide light in the chip;
the ridge comprises a first end and a second end;
the first end is opposite the second end;
the platform comprises a waveguide; and
the second end is optically coupled with the waveguide;
etching the chip to form a first wall and a second wall in the chip, wherein:

the etching the chip forms the first wall and the second wall in the chip between the first edge of the chip and the second edge of the chip; and the etching the chip to form the first wall defines the second end of the ridge; and applying a coating to the first wall to form the mirror, wherein:

the coating comprises a metal;

the coating comprises a dielectric layer; and the dielectric layer is between the first wall and the metal.

14. The method of claim 13, wherein etching the chip to form the first wall and the second wall occurs after bonding the chip to the platform.

15. The method of claim 13, further comprising applying the coating to the second wall concurrently with applying the coating to the first wall.

16. The method of claim 15, wherein applying the coating comprises applying the metal to the dielectric layer after applying the dielectric layer to the first wall and the second wall.

17. The method of claim 16, wherein:

the first wall and the second wall define a recessed region in the chip; and applying the coating to the first wall also applies the coating to the second wall, such that the mirror comprises two reflective surfaces.

18. A semiconductor laser comprising:

a chip, wherein:

the chip is made of a semiconductor material;

the semiconductor material has a direct bandgap;

the chip comprises a first edge;

the chip comprises a second edge; and the first edge is opposite the second edge;

a first wall and a second wall in the chip, wherein:

the first wall and the second wall are between the first edge and the second edge;

the first wall is opposite the second wall; and the first wall and the second wall define a recessed portion in the chip; and a coating disposed on the first wall and on the second wall, wherein:

the coating comprises a metal;

the coating comprises a dielectric layer between the metal and the first wall; and the coating forms a mirror in the chip.

19. The semiconductor laser as recited in claim 18, comprising:

a platform, wherein:

the platform is made of a first semiconductor material;

the platform comprises a waveguide; and the chip is bonded to the platform; and a ridge formed in the chip, wherein:

the ridge is configured to guide light in the chip;

the ridge comprises a first end and a second end;

the first end is opposite the second end;

the first end terminates at the mirror; and the second end is optically coupled with the waveguide.

20. The semiconductor laser as recited in claim 18, comprising:

three or more ridges formed in the chip, wherein each ridge of the three or more ridges terminates at the mirror; and three or more waveguides, wherein the three or more waveguides are each optically coupled with one ridge of the three or more ridges.

* * * * *